US011038214B2

(12) United States Patent
Rahimian et al.

(10) Patent No.: US 11,038,214 B2
(45) Date of Patent: Jun. 15, 2021

(54) SYSTEMS AND METHODS OF MANAGING BATTERY CELL DEGRADATION

(71) Applicant: SF Motors, Inc., Santa Clara, CA (US)

(72) Inventors: Saeed Khaleghi Rahimian, Santa Clara, CA (US); Sangwoo Han, Santa Clara, CA (US); Ying Liu, Santa Clara, CA (US); Yifan Tang, Santa Clara, CA (US)

(73) Assignee: SF MOTORS, INC., Santa Clara, CA (US)

( * ) Notice: Subject to any disclaimer, the term of this patent is extended or adjusted under 35 U.S.C. 154(b) by 130 days.

(21) Appl. No.: 16/255,296

(22) Filed: Jan. 23, 2019

(65) Prior Publication Data

US 2020/0235441 A1    Jul. 23, 2020

(51) Int. Cl.
  *H01M 10/48* (2006.01)
  *H01M 10/42* (2006.01)
  *G01R 31/392* (2019.01)
  *H01M 10/0525* (2010.01)
  *H01M 10/04* (2006.01)

(52) U.S. Cl.
  CPC .......... *H01M 10/48* (2013.01); *G01R 31/392* (2019.01); *H01M 10/049* (2013.01); *H01M 10/0525* (2013.01); *H01M 10/425* (2013.01); *H01M 2010/4271* (2013.01)

(58) Field of Classification Search
  None
  See application file for complete search history.

(56) References Cited

U.S. PATENT DOCUMENTS

| 2007/0182418 A1* | 8/2007 | Reynier | H01M 6/50 324/429 |
| 2009/0239130 A1* | 9/2009 | Culver | H01M 10/052 429/50 |
| 2009/0309549 A1* | 12/2009 | Shih | G01R 31/3835 320/136 |

(Continued)

OTHER PUBLICATIONS

Fu et al., "Development of a Physics-based Degradation Model for Lithium Ion Polymer Batteries Considering Side Reactions," Journal of Power Sources, 278, 2015, pp. 506-521.

(Continued)

*Primary Examiner* — Ula C Ruddock
*Assistant Examiner* — Anna Korovina
(74) *Attorney, Agent, or Firm* — Foley & Lardner LLP; James De Vellis

(57) ABSTRACT

Systems and methods to manage battery cell degradation are provided. The system determines anode stoichiometry bounds in full-cell and cathode stoichiometry bounds in full-cell. The system measures a cell open circuit voltage subsequent to a rest duration. The system identifies, via a data fitting technique and the cell open circuit voltage, a change in the anode stoichiometry bounds in full-cell and a change in the cathode stoichiometry bounds in full-cell. The system determines a total cyclable lithium ion for the battery cell, an amount of anode active material and an amount of anode cathode material. The system determines a primary capacity fade mechanism for the battery cell. The system generates a battery health indicator, selects a command, and provides the command to manage power consumption from the battery cell.

20 Claims, 4 Drawing Sheets

(56) References Cited

U.S. PATENT DOCUMENTS

2013/0317771 A1* 11/2013 Laskowsky ............ B60L 58/16
702/63
2015/0329008 A1* 11/2015 Karlson ................. B60L 58/13
701/22

OTHER PUBLICATIONS

H. He et al., Online model-based estimation of state-of-charge and open-circuit voltage of lithium-ion batteries in electric vehicles, Energy 39 (2012) 310-318.
J. Vetter et al., Ageing mechanisms in lithium-ion batteries, Journal of Power Sources, 147 (2005) 269-281.
M. Dubarry et al., Identify capacity fading mechanism in a commercial LiFePO4 cell, Journal of Power Sources 194 (2009) 541-549.

* cited by examiner

SYSTEMS AND METHODS OF MANAGING BATTERY CELL DEGRADATION

BACKGROUND

Vehicles such as automobiles can include batteries that provide power to components of the vehicle. The amount of power or the duration of power supplied by the battery can vary.

SUMMARY

At least one aspect is directed to a system to manage battery cell degradation. The system can include a battery management system having one or more processors and memory. The battery management system can include or execute a battery health component and a battery controller component. The battery management system can apply a data fitting technique to half-cell open circuit voltages and full-cell open circuit voltages corresponding to a battery cell. The battery management system can determine anode stoichiometry bounds in full-cell corresponding to the battery cell at a minimum state of charge and a maximum state of charge, and cathode stoichiometry bounds in full-cell corresponding to the battery cell at the minimum state of charge and the maximum state of charge. The battery management system can measure a cell open circuit voltage at a plurality of states of charge of the battery cell subsequent to a rest duration. The battery management system can identify, via a data fitting technique and the cell open circuit voltage at the plurality of states of charge, a change in the anode stoichiometry bounds in full-cell and a change in the cathode stoichiometry bounds in full-cell. The battery management system can determine, responsive to the change in the anode stoichiometry bounds in full-cell and the change in the cathode stoichiometry bounds in full-cell, a total cyclable lithium ion for the battery cell, an amount of anode active material and an amount of cathode active material. The battery management system can determine, based on the total cyclable lithium ion for the battery cell, the amount of anode active material and the amount of cathode active material, a primary capacity fade mechanism for the battery cell comprising one of loss of cyclable lithium ion, loss of anode active material, or loss of cathode active material. The battery management system can generate a battery health indicator based on the primary capacity fade mechanism for the battery cell. The battery management system can select a command based on the battery health indicator to manage power consumption from the battery cell. The battery management system can provide the command for execution to manage the power consumption from the battery cell.

At least one aspect is directed to a method of managing battery cell degradation. The method can include a battery management system determining, based on fitting half-cell open circuit voltages and full-cell open circuit voltages corresponding to a battery cell, anode stoichiometry bounds in full-cell corresponding to the battery cell at a minimum state of charge and a maximum state of charge, and cathode stoichiometry bounds in full-cell corresponding to the battery cell at the minimum state of charge and the maximum state of charge. The method can include the battery management system detecting a cell open circuit voltage at a plurality of states of charge of the battery cell subsequent to a rest duration. The method can include the battery management system identifying, via a data fitting technique and the cell open circuit voltage at the plurality of states of charge, a change in the anode stoichiometry bounds in full-cell and a change in the cathode stoichiometry bounds in full-cell. The method can include the battery management system determining, responsive to the change in the anode stoichiometry bounds in full-cell and the change in the cathode stoichiometry bounds in full-cell, a total cyclable lithium ion for the battery cell, an amount of anode active material and an amount of cathode active material. The method can include the battery management system determining, based on the total cyclable lithium ion for the battery cell, the amount of anode active material and the amount of cathode active material, a primary capacity fade mechanism for the battery cell comprising one of loss of cyclable lithium ion, loss of anode active material, or loss of cathode active material. The method can include the battery management system generating a battery health indicator based on the primary capacity fade mechanism for the battery cell. The method can include the battery management system selecting a command based on the battery health indicator to manage power consumption from the battery cell. The method can include the battery management system providing the command for execution to manage the power consumption from the battery cell.

At least one aspect is directed to an electric vehicle. The electric vehicle can include a battery management system. The battery management system can include one or more processors and memory. The battery management system can include or execute a battery health component and a battery controller component. The battery management system can apply a data fitting technique to half-cell open circuit voltages and full-cell open circuit voltages corresponding to a battery cell. The battery management system can determine anode stoichiometry bounds in full-cell corresponding to the battery cell at a minimum state of charge and a maximum state of charge, and cathode stoichiometry bounds in full-cell corresponding to the battery cell at the minimum state of charge and the maximum state of charge. The battery management system can measure a cell open circuit voltage at a plurality of states of charge of the battery cell subsequent to a rest duration. The battery management system can identify, via a data fitting technique and the cell open circuit voltage at the plurality of states of charge, a change in the anode stoichiometry bounds in full-cell and a change in the cathode stoichiometry bounds in full-cell. The battery management system can determine, responsive to the change in the anode stoichiometry bounds in full-cell and the change in the cathode stoichiometry bounds in full-cell, a total cyclable lithium ion for the battery cell, an amount of anode active material and an amount of cathode active material. The battery management system can determine, based on the total cyclable lithium ion for the battery cell, the amount of anode active material and the amount of cathode active material, a primary capacity fade mechanism for the battery cell comprising one of loss of cyclable lithium ion, loss of anode active material, or loss of cathode active material. The battery management system can generate a battery health indicator based on the primary capacity fade mechanism for the battery cell. The battery management system can select a command based on the battery health indicator to manage power consumption from the battery cell. The battery management system can provide the command for execution to manage the power consumption from the battery cell.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Figure 1:
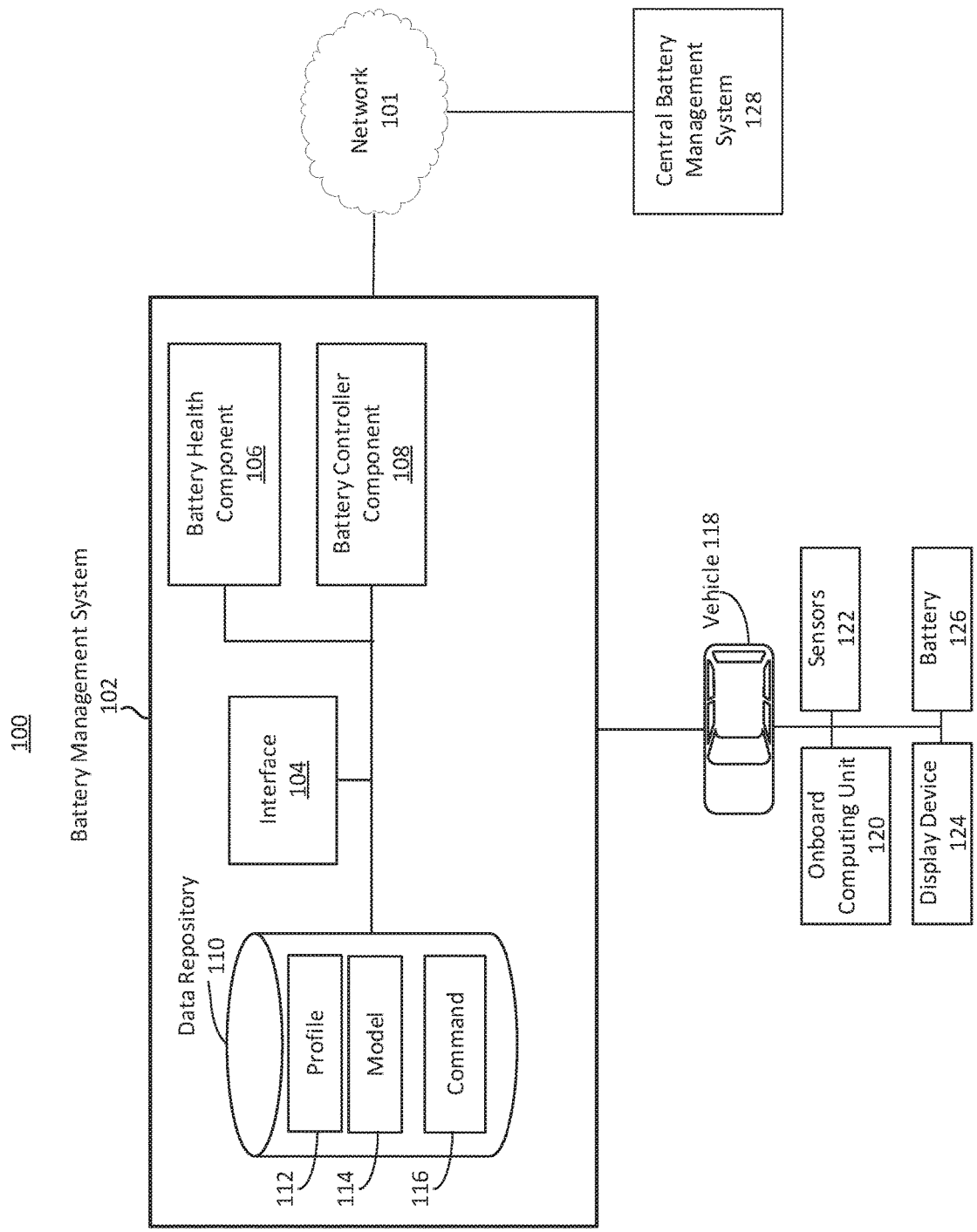
FIG. 1 depicts a block diagram depicting an example system to manage battery cell degradation, in accordance with an implementation.

Following below are more detailed descriptions of various concepts related to, and implementations of, methods, apparatuses, and systems of managing battery degradation. The various concepts introduced above and discussed in greater detail below may be implemented in any of numerous ways.

The present disclosure is directed to systems and methods of managing battery degradation, such as a battery of a vehicle (e.g., an electric vehicle or hybrid electric and gas vehicle). The vehicle, for example, can include one or more batteries having one or more battery cells. The batteries can provide power to various component of the vehicle, such as an electric motor. The battery cell degradation can affect the state of health of the battery, which can affect the amount of battery power the battery can provide. The amount of battery power available can impact the distance an electric vehicle can travel before recharging the battery.

However, the performance of lithium ion ("Li-ion" or "Li+") batteries can degrade during cycling or under storage conditions due to a loss in capacity of cells of the battery and an increase in resistance. The performance of the Li-ion battery can degrade due to several cell aging mechanisms. For example, the performance in Li-ion cells (e.g., graphite anode, metal oxide cathode) can degrade due to one or more of Solid Electrolyte Interphase (SEI) formation on anode (e.g., graphite) particles, SEI film growth, metallic Li plating side reaction in anode, particle cracking, contact loss of active material particles or electrode porosity reduction. These degradation mechanisms can be categorized into three main capacity fade mechanisms: i) loss of cyclable ii) loss of anode active material, and iii) loss of cathode active material. For example, SEI formation and Li plating can contribute primarily to loss of cyclable $Li^+$ while the particle cracking is mostly responsible for loss of electrodes' active materials.

However, accurately and reliably determining the amount of battery cell degradation can be challenging due to various factors. For example, determining battery cell degradation can be tedious, require numerous measurements, be computationally intensive, utilize excessive amounts of processing power or memory utilization. Predicting battery cell degradation can be invasive, slow or take a significant amount of time due to the level of complexity of the determination techniques. For example, it can be challenging to determine how different cycling and storage conditions impact the cell life. While it may be possible to perform reference performance tests (RPTs) frequently (e.g. biweekly) to monitor the cell capacity and resistance in order to facilitate cell design optimization, building cycle/calendar life models for offline state of health (SOH) estimation and cell life prediction for warrantee purposes, such RPT information may not provide sufficient information to determine the detailed fading mechanisms. Therefore, it may not possible to determine the mechanisms by which the performance of the battery cell degrades using RPT information. Another test, such as the incremental capacity analysis ("ICA"), which is a non-invasive method, may facilitate determining the factors that contribute to capacity fading. However, the ICA test utilizes the cell open circuit voltage (OCV) measurement for the entire cell state-of-charge (SOC) range, which can take at least more than a day. Further, the ICA method may be prone to numerical errors due to using the derivative of OCV with respect to capacity. Performing invasive tests to determine the degradation mechanism, however, may also be inefficient as they are time consuming, may damage the battery and prevent the battery from being used again. Thus, it can be technically challenging to efficiently, accurately, and reliably determine the mechanisms that cause performance degradation of a Li-ion battery cell in a non-invasive manner.

Systems and methods of the present technical solution can determine the mechanisms causing degradation in battery cell performance, and thereby facilitate the management of the battery cell degradation to improve battery performance, battery cell life, performance of a vehicle powered by the batter cell, or cell design. To do so, a battery management system of the present technical solution can determine a cell open circuit voltage ("OCV"). The cell OCV can vary with cell state of health ("SOH") due to anode and cathode stoichiometry. Stoichiometry can refer to the relationship between the relative quantities of substances taking part in a reaction or forming a compound. The stoichiometry can refer to the numerical coefficients in a chemical reaction equation. For example, the anode and cathode stoichiometry can refer to or include the variable "x" in $Li_xC_6$ anode, and the variable "y" in $Li_yNiCoAlO_2$ cathode. The cell OCV, and therefore the cell SOH, can vary based on a change caused by loss of cyclable $Li^+$ and the active materials of the electrodes (e.g., anode and cathode). The battery management system of the present technical solution can track the anode and cathode stoichiometry change, as well as any change in the anode and cathode active material weight fractions, by fitting the cell OCV data during the cell life. Thus, the battery management system of the present technical solution can determine how the total cyclable $Li^+$, total anode capacity and total cathode capacity vary with the cell SOH. The non-invasive method of the present technical solution can take, as input, cell OCV at a predetermined number of states of charge. The predetermined number of states of charge can be 3, 4, 5, 6, 7, 8 or more. The states of charge can include, for example, 100%, 70%, 50%, or 20%. The cell OCV can be determined using one or more sensors to measure the cell voltage after a time interval of rest (e.g., 2 hours, 3 hours, 4 hours, 5 hours or more), or using online model-based estimation method. By fitting the cell OCV data from a few different states of charge, the battery management system can determine a total amount of cyclable Li+. Based on the total cyclable Li+, the battery management system can then determine the cause of performance degradation of the battery cell. The battery management system can then manage the degradation of the battery based on the cause of degradation by sending one or more commands to the battery or vehicle using the battery.

FIG. 1 depicts a block diagram depicting an example system to manage battery performance of a vehicle. The system 100 can include at least one battery management system 102. The battery management system ("BMS") 102 can include at least one interface 104, at least one battery health component 106, at least one battery controller component 108, and at least one data repository 110. The battery management system 102, or one or more component thereof, can include hardware or a combination of hardware and software, such as communications buses, circuitry, processors, communications interfaces, among others. The battery management system 102 can reside on or within a vehicle (e.g., vehicle 118), on a computing device, on a server, or other location or hardware infrastructure configured to facilitate vehicle or battery control, design, or manufacturing.

The data repository 110 can store, manage or reference information to facilitate battery control, design, or manufacturing. The data repository 110 can include one or more data structure, databases or data files to store the information. For example, the data repository 110 can include profile information 112, model information 114, or command information 116. The profile information 112 can include, for example, a profile data structure. The profile information 112 can include, for example, battery profile information such as electrochemical parameters, or stoichiometry. The profile can include the stoichiometry range and OCV's for each electrode. In some cases, the profile can include electrochemical parameters for the battery, such as a particle size, an electrode thickness, a porosity, or an open circuit voltage. The profile information 112, including the input parameters of Table 1, can be input into a component of the battery management system 102 for further processing. Examples of additional profile information 112 are provided in Table 1.

TABLE 1

| Profile Information | |
| --- | --- |
| Name | Unit |
| Anode particle radius | μm |
| Cathode particle radius | μm |
| Anode solid diffusivity | m²/s |
| Cathode solid diffusivity | m²/s |
| Anode solid maximum concentration | mol/m³ |
| Cathode solid maximum concentration | mol/m³ |
| Anode stoichiometry at 0% SOC | — |
| Anode stoichiometry at 100% SOC | — |
| Cathode stoichiometry at 0% SOC | — |
| Cathode stoichiometry at 100% SOC | — |
| Cell cross area | m² |
| Anode film resistance | Ωm² |
| Cathode film resistance | Ωm² |
| Anode exchange current density at reference state | A/m² |
| Cathode exchange current density at reference state | A/m² |
| Electrolyte transference number | — |
| Initial electrolyte concentration | mol/m³ |
| Electrolyte conductivity | S/m |
| Electrolyte diffusivity | m²/s |
| Anode solid conductivity | S/m |
| Cathode solid conductivity | S/m |
| Anode thickness | μm |

TABLE 1-continued

| Profile Information | |
| --- | --- |
| Name | Unit |
| Separator thickness | μm |
| Cathode thickness | μm |
| Anode Bruggeman exponent | — |
| Separator Bruggeman exponent | — |
| Cathode Bruggeman exponent | — |
| Anode active materials volume ratio | — |
| Anode electrolyte volume ratio | — |
| Cathode active materials volume ratio | — |
| Cathode electrolyte volume ratio | — |
| Separator electrolyte volume ratio | — |
| Anode entropy coefficient | V/K |
| Cathode entropy coefficient | V/K |
| Anode open circuit voltage | V |
| Cathode open circuit voltage | V |

For example, cathode materials used in lithium batteries can include Lithium cobalt oxide $LiCoO_2$, Lithium nickel oxide $LiNiO_2$, Lithium manganese oxide $LiMn_2O_4$, or Lithium iron phosphate $LiFePO_4$. Example anode materials can include Carbon C, Lithium Li, or Lithium titanate $Li_2TiO_3$.

The data repository 110 can include or store one or more models 114. The model 114 can refer to any model that can be used by the battery management system 102. To determine, predict, evaluate or otherwise identify parameter, metric, behavior or characteristic associated with a battery or battery cell (e.g., battery 126). Models 114 can include, for example, OCV data curves, data fitting models, historical models, historical performance models, or stoichiometry models. The data repository 110 can store or include different models 114 for different types of batteries. The data repository 110 can include or store commands 116. Commands 116 can include, for example, instructions, control commands, vehicle controls, alerts, or notifications. Commands 116 can include instructions to modify or change a parameter or function related to battery utilization.

The system 100 can include or interface with a central battery management system 128. The central battery management system 128 can include one or more component or functionality of the battery management system 102. For example, the battery management system 102 can be referred to as a vehicle battery management system, and the central battery management system 128 can be remote from the vehicle battery management system. The central battery management system 128 can communicate or interface with the vehicle battery management system 102. The central battery management system 128 can communicate or interface with one or more component of the vehicle 118, for example via the battery management system 102.

Each of the components of the battery management system 102 or central battery management system 128 can be implemented using hardware or a combination of software and hardware. Each component of the battery management system 102 (or central battery management system 128) can include logical circuitry (e.g., a central processing unit or CPU) that responses to and processes instructions fetched from a memory unit (e.g., memory 415 or storage device 425). Each component of the battery management system 102 can include or use a microprocessor or a multi-core processor. A multi-core processor can include two or more processing units on a single computing component. Each component of the battery management system 102 can be based on any of these processors, or any other processor capable of operating as described herein. Each processor can utilize instruction level parallelism, thread level parallelism, different levels of cache, etc. For example, the battery management system 102 can include at least one logic device such as a computing device or server having at least one processor to communicate via the network 101. A battery management system 102 of the vehicle 118 can communicate with a different battery management system 102 or central battery management system 128.

The components and elements of the battery management system 102 can be separate components, a single component, or part of the battery management system 102. For example, the interface 104, battery health component 106, battery controller component 108 (and the other elements of the battery management system 102) can include combinations of hardware and software, such as one or more processors configured to initiate stop commands, initiate motion commands, and transmit or receive timing data, for example.

One or more component of the battery management system 102 can be hosted on or within a vehicle 118. One or more components of the battery management system 102 can reside outside or remote from the vehicle 118, and be in communication with the vehicle for at least a certain time period. For example, portions of data illustrated on the data repository 110 can reside on a remote server, a central battery management system 128, or cloud of servers, that can maintain profile information, models, commands, or other information that can be accessed by the battery management system 102 (e.g., through network 101). The components of the battery management system 102 can be connected or communicatively coupled to one another. The connection between the various components of the battery management system 102 can be wired or wireless, or any combination thereof. Counterpart systems or components can be hosted on other vehicles to enable communication or coordination between vehicles.

The network 101 can include computer networks such as the internet, local, wide, near field communication, metro or other area networks, as well as satellite networks or other computer networks such as voice or data mobile phone communications networks, and combinations thereof. The network 101 can include or constitute an inter-vehicle communications network, e.g., a subset of components including the battery management system 102 and components thereof for inter-vehicle data transfer. The network 101 can include a point-to-point network, broadcast network, telecommunications network, asynchronous transfer mode network, synchronous optical network, or a synchronous digital hierarchy network, for example. The network 101 can include at least one wireless link such as an infrared channel or satellite band. The topology of the network 101 can include a bus, star, or ring network topology. The network 101 can include mobile telephone or data networks using any protocol or protocols to communicate among vehicles or other devices, including advanced mobile protocols, time or code division multiple access protocols, global system for mobile communication protocols, general packet radio services protocols, or universal mobile telecommunication system protocols, and the same types of data can be transmitted via different protocols.

The vehicle 118 can refer to any type of vehicle or automobile such as cars, trucks, vans, sports utility vehicles, motorcycles, self-driving vehicle, driver assist vehicle, electric vehicle, hybrid vehicle, or fossil fuel powered vehicle. The vehicle 118 can include an onboard computing unit 120. The onboard computing unit 120 can include one or more of hardware, software or firmware. The onboard computing unit 120 can include digital components or circuitry, including, for example, one or more component depicted in FIG. 4.

The onboard computing unit 120 can include or interface with, for example, an electronic control unit ("ECU") of the vehicle 118 to provide drive-by-wire functionality. The onboard computing unit 120 can include or be referred to as an automotive computer, and can include a processor or microcontroller, memory, embedded software, inputs/outputs and communication link(s). An ECU involves hardware and software to perform the functions expected from that particular module. For example, types of ECU include Electronic/engine Control Module (ECM), Powertrain Control Module (PCM), Transmission Control Module (TCM), Brake Control Module (BCM or EBCM), Central Control Module (CCM), Central Timing Module (CTM), General Electronic Module (GEM), Body Control Module (BCM), Suspension Control Module (SCM), control unit, or control module. Other examples include domain control unit (DCU), Electric Power Steering Control Unit (PSCU), Human-machine interface (HMI), Telematic control unit (TCU), Speed control unit (SCU), Battery management system (BMS). For example, the onboard computing unit 120 of the vehicle 118 can query one or more component or module of vehicle 118 to determine a status of the vehicle 118, which can include, for example, a location or GPS position of the vehicle, speed of the vehicle, acceleration of the vehicle, turn angle of the vehicle, orientation of the vehicle, throttle of the vehicle, brake status or brake amount, or other information.

The vehicle 118 can include or interface with one or more sensors 122. The sensors 122 can be coupled to or associated with a vehicle 118. The sensors 122 can provide information to the battery management system 102. The one or more vehicle 118 can include sensors 122 that are designed, constructed, configured or operational to detect a value of a current output from the battery 126. Sensors 122 can include measurement devices configured to measure, detect, or determine characteristics of electricity associated with a battery 126 of the vehicle, such as a current, voltage, or impedance. Sensors 122 can include an ammeter, volt meter, or multimeter. The sensor 122 can measure current, such as a flow of electric charge or coulombs per second in units of amperes. Sensor 122 can measure an open circuit voltage of an anode or cathode. Sensor 122 can measure half-cell characteristics of electricity or full-cell characteristics of electricity.

Sensors 122 can include a temperature sensor, thermometer, or ambient temperature sensor. The sensors 122 can be part of the vehicle 118, or remote from the vehicle 118. Sensors 122 can include, for example, a radar sensor, lidar sensor, or camera. Sensors 122 of the vehicle 118 can include accelerometers, gyroscopes, weight sensors, or proximity sensors, that can collect, detect or determine vehicle dynamics information such as orientation data, velocity, or weight. The sensor 122 can identify, measure, detect or otherwise determine a value of a current output by the battery 126 (or one or more cells thereof) that supplies power to the vehicle 118. The sensor 122, or onboard computing unit 120 or battery management system 102, can receive the value of the current output. The sensor 122, onboard computing unit 120, or battery management system 102 can associate the value of the current output with a timestamp. The timestamp can correspond or refer to the time at which the value of the current was detected or identified by the sensor 122. The timestamp can correspond or refer to the time at which the value of the current was received by the onboard computing unit 120, battery management system 102 or stored in a data repository 110. The timestamp can correspond or refer to a time at which the battery outputs the current. The timestamp can be relative, based on a local time, based on a GPS time, or based on a universal time. The timestamp can be a sample count, such as a numerical consecutive counter (e.g., 1, 2, 3, 4).

Sensors 122 can include one or more sensing elements or transducers that capture, acquires, records or converts information about vehicle 118 or environment into a form for processing. The sensor 122 can acquire one or more images or recordings (e.g., photographic, radar, ultrasonic, millimeter wave, infra-red, ultra-violet, light detection and ranging or lidar, or audio, or video). The sensor 122 can communicate sensed data to the battery management system 102 for processing.

The sensor 122 can include a camera as well as one or more sensors of one or more types. For example, the sensor 122 can include a Radar, light detection and ranging (LIDAR), ultrasonic, or vehicle-to-everything (V2X) (e.g., vehicle-to-vehicle (V2V), V2I, vehicle-to-device (V2D), or vehicle-to-passenger (V2P)) sensor or interface. The sensor 122 can include a global positioning system (GPS) device that can determine a location of the vehicle using map data. The sensor 122 can detect (e.g., using motion sensing, imaging or any of the other sensing capabilities) whether any other vehicle or object is present at or approaching the vehicle 118.

The vehicle 118, via sensor 122 or the onboard computing unit 120, can interface or communicate with a location system via network 101. The location system can include any device based on a positioning system such as Global Navigation Satellite System (GNSS), which can include GPS, GLONASS, Galileo, Beidou and other regional systems. The location system can include one or more cellular towers to provide triangulation. The location system can include wireless beacons, such as near field communication beacons, short-range wireless beacons (e.g., Bluetooth beacons), or Wi-Fi modules. The vehicle 118 can include or interface with a device, component, antenna, or other module or element to determine a location of the vehicle 118 via the location system.

The vehicle 118 can include a display device 124. The display device 124 can include, for example, a vehicle dash, LCD, LED, or other electronic or digital visual display communicatively coupled to the onboard computing unit 120 or battery management system 102. The display device 124 can include a heads-up display, mechanical display, or digital or electronic display.

The vehicle 118 can include a battery 126. The battery 126 can be a rechargeable battery. The battery can be a one-time-use or disposable battery. The battery can include one or more battery cells. For example, battery 126 can refer to multiple battery cells. The multiple battery cells can be independent from one another, but stored in a same physical container or area. The multiple battery cells of the battery 126 can be electronically or communicatively coupled to on another. For example, the one or more battery cells in the battery 126 can be connected by electronic circuitry in a series or in a parallel configuration. The battery management system 102 can monitor, manage, or control aspects of the battery 126. The battery 126 can include an electric vehicle battery such as a 21700 battery cell. The battery 126 can be included with a plurality of other batteries 126 in a battery pack installed in the vehicle 118 to power the vehicle 118 (e.g., an electric vehicle.)

The battery 126 can refer to or include a battery pack with multiple battery cells. The battery cells included in the battery pack can include a lithium-air battery cell, a lithium ion battery cell, a nickel-zinc battery cell, a zinc-bromine battery cell, a zinc-cerium battery cell, a sodium-sulfur battery cell, a molten salt battery cell, a nickel-cadmium battery cell, or a nickel-metal hydride battery cell, among others. Each battery cell in the battery pack can have or define a positive terminal and a negative terminal. Both the positive terminal and the negative terminal can be along a top surface of the battery cell. The shape of the battery cell can be a prismatic casing with a polygonal base, such as a triangle, square, a rectangular, a pentagon, or a hexagon. The shape of the battery cell can also be cylindrical casing or cylindrical cell with a circular (e.g., as depicted), ovular, or elliptical base, among others. A height of each battery cell can range between 50 mm to 90 mm. A width or diameter of each battery cell can range between 16 mm to 26 mm. A length or diameter of each battery cell can range between 16 mm to 26 mm. For example, a battery cell of the 18650 types can have a diameter of 18 mm and a height of 65 mm and a battery cell of the 21700 type can have a diameter of 21 mm and a height of 70 mm.

The battery 126 can include one or more cells. A cell can refer to the electrochemical current-producing unit in a battery, consisting of a set of positive plates, negative plates, electrolyte, separators and casing. The cell can have an open-circuit voltage of, for example, 1 volt, 2 volts, 3 volts, volts or some other voltage. There can be multiples cells in a single battery 126. Types of batteries 126 or battery cells can include, for example, lead-acid ("flooded", deep-cycle, and VRLA), NiCd, nickel-metal hydride, lithium-ion, Li-ion polymer, zinc-air or molten-salt batteries.

A lithium-ion battery or Li-ion battery (abbreviated as LIB) is a type of rechargeable battery in which lithium ions move from the negative electrode to the positive electrode during discharge and back when charging. Li-ion batteries use an intercalated lithium compound as one electrode material, compared to the metallic lithium used in a non-rechargeable lithium battery. The electrolyte, which allows for ionic movement, and the two electrodes are the constituent components of a lithium-ion battery cell. For example, lithium-ion battery can be used to provide power to an electric vehicle 118. A lithium-ion battery can have a high energy density, low memory effect, and a low self-discharge. Types of lithium based batteries 126 can include, for example, Lithium iron phosphate (LiFePO$_4$), lithium ion manganese oxide battery (LiMn$_2$O$_4$, Li$_2$MnO$_3$, or LMO), and lithium nickel manganese cobalt oxide (LiNiMnCoO$_2$ or NMC), lithium nickel cobalt aluminum oxide (LiNiCoAlO$_2$ or NCA) and lithium titanate (Li$_4$Ti$_5$O$_{12}$ or LTO), or lithium-sulfur batteries.

The battery management system 102 can include an interface 104. The interface 104 can be configured to use one or more protocols, wires, connectors, or ports to communicate with or facilitate communication among the one or more components of the battery management system 102, vehicle 118, or central battery management system 128. The interface 104 can include a hardware interface, software interface, wired interface, or wireless interface. The interface 104 can facilitate translating or formatting data from one format to another format. For example, the interface 104 can include an application programming interface that includes definitions for communicating between various components, such as software components. The interface 104 can be designed, constructed or operational to communicate with one or more sensors 122 to collect or receive information. The interface 104 can be designed, constructed or operational to communicate with a battery health component 106, battery controller component 108 or data repository 110.

The battery management system 102 can include, interface or otherwise access a battery controller component 108. The battery controller component 108 can be referred to as a main component, orchestrator component, or master component. For example, the battery controller component 108 can orchestrate, manage, or maintain one or more other components of the battery management system 102, such as the battery health component 106, or transmit instructions to one or more component of the vehicle 118, such as the onboard computing unit 120. For example, the battery controller component 108 can receive, from sensor 122, a characteristic of electricity associated with the battery 126. The characteristic of electricity associated with the battery 126 can include, for example, a current or flow of charge (e.g., represented in units such as amperes, or milliamperes). The current can correspond to moving electrons in a wire or carried by ions in an electrolyte. The characteristic of electricity associated with the battery 126 can include, for example, a voltage. The voltage can refer to an open circuit voltage determine when there is no current flow.

The battery management system 102 (e.g., via battery controller component 108) can receive, detect, identify, or measure a value of a current output by the battery 126. The battery 126 can supply power to one or more component or motor of the vehicle 118. The battery management system 102 (e.g., via battery controller component) can provide, responsive to receiving the value of the current, the value of the current to one or more component of the battery management system 102 for further processing. The value of the current can include or refer to a time-dependent function of the current, or a sample or value of the current at a specific time, such as corresponding to a timestamp.

To facilitate determining the stoichiometry of the anode and cathode in full-cell, the battery management system 102 can determine stoichiometry bounds for the anode in half-cell and the cathode in half-cell. To do so, the battery management system can measure or detect electrode OCV values at various states of charge for a dissected battery cell. The battery management system 102 can determine the open circuit voltage of the anode in half-cell at a first state-of-charge and an open circuit voltage of the anode in half-cell at a second state-of-charge. The battery management system 102 can determine the stoichiometry bounds for a cathode in half-cell corresponding to the battery cell based on an open circuit voltage of the cathode in half-cell at the first state-of-charge and an open circuit voltage of the cathode in half-cell at the second state-of-charge. The battery management system 102 can measure open circuit voltages of an anode in half-cell corresponding to the battery cell based on a dissected battery cell. The battery management system 102 can measure open circuit voltages of a cathode in half-cell corresponding to the battery cell based on the dissected battery cell.

The battery health component 106 can identify a stoichiometry in full-cell for an anode of a cell of the battery 126. The battery health component 106 can identify a stoichiometry in full-cell for a cathode of the cell of the battery 126. The battery health component 106 can determine the stoichiometry of the anode and the cathode at a state-of-charge of the battery 126. For example, the battery state-of-charge can be 100% when the battery health component 106 determines the stoichiometry in full-cell for the anode and the cathode. The state-of-charge can be a maximum state-of-charge (e.g., 100%, 99%, or 98%), minimum state of charge (e.g., 0%, 1%, or 2%), or some other state-of-charge that facilities determining the stoichiometry of the anode and the cathode in full-cell to determine a cause of performance degradation.

The battery health component 106 can determine anode stoichiometry bounds in full-cell corresponding to the battery cell at a minimum state of charge and a maximum state of charge. Bounds can refer to or include a range or limit. The battery health component 106 can determine a cathode stoichiometry bounds in full-cell corresponding to the battery cell at the minimum state of charge and the maximum state of charge. The minimum state of charge can include, for example, a predetermined minimum state of charge such as 0%, 5%, 10%, 15%, 20% or some other minimum state of charge. The anode and cathode stoichiometry bounds in full-cell can correspond to a battery cell. The anode and cathode stoichiometry bounds can be determined, computed, measured, or otherwise identified using a battery cell that is different from the battery cell in the vehicle 118. The battery cell used to determine the initial stoichiometry bounds in full-cell can be a same type of battery cell used to power the vehicle 118. For example, the battery pack in the vehicle 118 can have multiple batteries or battery cells of the same type. The battery health component 106 can identify the stoichiometry bounds in full-cell using a battery cell from the battery pack, or a battery cell that is the same as the type of battery cell present in the battery pack. Thus, a battery cell corresponding to the battery cell in the vehicle 118 can refer to a battery cell that is of a same type or representative of a battery cell in the vehicle 118.

The battery health component 106 can determine the electrode stoichiometry based on a data fitting technique applied to half-cell open circuit voltages and full-cell open circuit voltages corresponding to the battery cell. The battery health component 106 can detect an open circuit voltage for the anode of the cell of the battery 126, and an open circuit voltage for the cathode of the cell of the battery 126. The open circuit voltage can refer to the difference of electrical potential between two terminals of a device when disconnected from a circuit such that there is no external load (e.g., no external electric current). The battery health component 106 can determine the open circuit voltage in an offline mode for a battery 126 that may not be connected or installed in a vehicle 118. For example, the battery health component 106 can determine the open circuit voltages in half-cell for the anode and cathode in an offline mode. To obtain the half-cell OCVs, a battery cell can be dissected and half-cells can be built. The battery health component 106 or other component or device can measure the anode and cathode OCVs in half-cell.

The battery health component 106 can determine the open circuit voltage for a battery 126 in an online mode in which the battery 126 is installed in a vehicle 118. To determine the open circuit voltage in an online mode, the battery health component 106 can wait until the battery 126 (or a cell thereof) has rested for a predetermined amount of time. Resting can refer to the battery 126 not being charged or discharged. For example, the battery health component 106 can utilize a timer or clock to determine a predetermined time interval or duration after the battery 126 has stopped providing or receiving current or power, or after the battery 126 has stopped providing or receiving current or power that is less than or equal to a threshold (e.g., 1 milli ampere, 2 milli amperes, 10 micro amperes). The predetermined amount of time can include, for example, 2 hours, 2.5 hours, 3 hours, 3.5 hours, 4 hours or more. In some cases, the battery health component 106 can estimate OCV during pulse conditions by applying an online estimation technique.

The battery health component 106 can establish or determine stoichiometry bounds for the anode in half-cell and stoichiometry bounds for the cathode in half-cell. Stoichiometry bounds can refer to or include stoichiometry limits. The battery health component 106 can determine the stoichiometry limits for each electrode (e.g., anode and cathode) in full cell at different states of charge (e.g., 0% state-of-charge and 100% state-of-charge). The battery health component 106 can obtain the stoichiometry range for each electrode by fitting the full-cell OCV using half-cell OCVs. The stoichiometry range for each electrode in full-cell may be narrower than in half-cell. Therefore, the total cyclable Li+ may be greater than the usable cyclable Li+ due to cell voltage limits at end of charge and discharge. Thus, to track how the stoichiometry range for each electrode in full-cell changes during the cell life, the battery health component 106 can fit the cell OCV data to satisfy a data-fitting technique.

The battery health component 106 can apply the data fitting technique to half-cell open circuit voltages and full-cell open circuit voltages to determine the anode stoichiometry in full-cell and the cathode stoichiometry in full-cell. The OCV voltages can correspond to voltages for a battery cell at a minimum state of charge and a maximum state of charge. The battery health component 106 can further determine a total cathode capacity (e.g., based on or corresponding to an amount of cathode active material), a total anode capacity (e.g., based on or corresponding to an amount of anode active material), and a change in ampere hour of the battery cell. The anode active material or amount of anode active material can refer to an anode active materials volume ratio. The cathode active material or amount of cathode active material can refer to a cathode active materials volume ratio. The data fitting technique can include, for example, a nonlinear least-squares solver. The data fitting technique can solve nonlinear least-squares curve fitting functions. The data fitting technique can fit the data to satisfy one or more functions at different states-of-charge.

For example, the battery health component 106 can first determine the stoichiometry limits of each electrode in full cell at 0% and 100% SOCs, which can be obtained by fitting full-cell OCV using half-cell OCVs. To track how the stoichiometry range for each electrode in full-cell changes during the cell life, the battery health component 106 can fit the cell OCV data using a nonlinear least-squares technique to satisfy the following functions at different SOCs:

$$y = y_{100} + \frac{\Delta Ah \times (y_{max} - y_{min})}{Cap_C^T} \quad \text{[Function 1]}$$

$$x = x_{100} - \frac{\Delta Ah \times (x_{max} - x_{min})}{Cap_A^T} \quad \text{[Function 2]}$$

$$OCV_{cell} = OCV_C(y) - OCV_A(x) \quad \text{[Function 3]}$$

where $Cap_C^T$, $Cap_A^T$, $OCV_C$, $OCV_A$, $OCV_{cell}$ are total cathode capacity, total anode capacity, cathode OCV, anode OCV and cell OCV, respectively. $\Delta Ah$ (or change in ampere hour) can be calculated by coulomb counting. $y_{100}$, $x_{100}$ are the cathode and anode stoichiometries in full-cell, respectively at 100% SOC. Maximum and minimum stoichiometries in half-cells are denoted by $y_{max}$, $y_{min}$, $x_{max}$, $x_{min}$. The battery health component 106 can determine the total cyclable Li$^+$ using the following Function 4:

$$Cap_{Li^+}^T = \frac{(x_{100} - x_{min})}{x_{max} - x_{min}} \times Cap_A^T + \frac{(y_{100} - y_{min})}{y_{max} - y_{min}} \times Cap_C^T \quad \text{[Function 4]}$$

The battery health component 106 can be configured with a data fitting technique and Functions 1-4 to determine the total cyclable lithium-ion and electrode capacities. To do so, the battery health component 106 can use reliable anode and cathode OCVs. The battery health component 106 can obtain the reliable anode and cathode OCVs from data repository 110 (e.g., profile 112 or model 114). The battery health component can obtain the reliable anode and cathode OCVs by charging/discharging half-cells, made from fresh full-cells, at very low rates (e.g., less than C/20, C/30, or C/50). For example, the battery health component 106, battery management system 102 or other system can charge and discharge the battery cell at a rate less than or equal to a threshold (e.g., C/50) to detect the open circuit voltage for the anode of the battery cell.

The battery health component 106 can determine the stoichiometry limits of the electrodes in full-cell by fitting the full-cell OCV at the beginning of life using the measured half-cells' OCVs. Thereafter, to determine the total cyclable Li+, the battery health component 106 can measure or estimate the cell OCV during the cell life at a few SOCs at a time interval (e.g., every 2-3 weeks, every week, every 15 days, or every 30 days). By fitting the cell OCV data, the battery health component 106 can determine the total cyclable Li$^+$ and total electrodes' capacities during the life. The battery health component 106 can use the determined total cyclable Li+, anode capacity, and cathode capacity to determine the degradation mechanisms under a particular cycling or storage condition.

For example, in an online mode, the battery health component 106 can measure a cell open circuit voltage at a plurality of states of charge of the battery cell subsequent to a rest duration. The rest duration can be a time interval such as 2 hours, 3 hours, 4 hours or more during which the battery 126 is not being used to power the vehicle 118 or the battery 126 is providing power or current output that is less than a threshold (e.g., 5 mA, 1 mA, 0.5 mA or some other low current output).

The battery health component 106 can then determine or identify, via the data fitting technique, a total cyclable lithium-ion for the battery cell, an amount or loss of anode active material and an amount or loss of cathode active material. The battery health component 106 can use the data fitting technique and the measured cell open circuit voltage at a plurality of states of charge to determine a change in the anode stoichiometry bounds in full-cell and a change in the cathode stoichiometry bounds in full-cell.

The battery health component 106 can determine, responsive to the change in the anode stoichiometry bounds in full-cell and the change in the cathode stoichiometry bounds in full-cell, a total cyclable lithium ion for the battery cell, an amount of anode active material or anode capacity, and an amount of cathode active material or cathode capacity. The anode capacity can indicate an amount of loss in anode active material. The cathode capacity can indicate an amount of loss in cathode active material.

Thus, the battery management system 102 can determine the total cyclable lithium ion, anode active material, and cathode material for the battery cell absent the cell open circuit voltage across an entire cell state of charge range. Rather, the battery management system 102 can determine the total cyclable lithium ion for the battery cell based on a subset of cell open circuit voltages across a cell state of charge range (e.g., 100%, 70%, 50%, and 20%) in a non-invasive manner. The battery health component 106 can determine values for the total cyclable Li+, anode capacity, and cathode capacity. The battery management system 102 can improve the efficiency, reliability and accuracy of determining the total cyclable lithium ion, anode active material and cathode material by initially obtaining anode and cathode stoichiometry in half-cell from a dissected full-cell that corresponds to a battery cell in a vehicle, and then determining OCV values in full-cell for the battery cell in the vehicle 118 and a subset of states of charges as opposed to numerous states of charge (e.g., 4 states of charge as opposed to 6, 7, 8, 9, 10 or more states of charge).

Based on the total cyclable lithium ion, amount of loss anode active material and amount of loss of cathode active material, the battery health component 106 can determine a primary capacity fade mechanism for the battery cell (e.g., battery 126). The primary capacity fade mechanism can refer to or indicate the main cause of the loss or reduction in capacity of the battery 126. The primary fade mechanisms can include one of loss of cyclable lithium ion, loss of anode active material, or loss of cathode active material. To determine the primary fade mechanism, the battery health component 106 can compare the amount of loss of the cyclable lithium ion, anode active material and cathode active material. The battery health component 106 can determine which material had the greatest loss, and select that material as the primary fade mechanism. The loss can be represented as an absolute value, percentage, ratio, fraction or other indicator. The loss can be normalized to facilitate comparison. The loss can be determining by comparing a previous amount or value of the material stored in the data repository 110 or memory of the battery management system 102. Using the total cyclable Li+, the amount of anode active material or anode capacity, and the amount of cathode active material or cathode capacity, the battery health component 106 can generate a battery health indicator. The battery health component 106 can generate a battery health indicator based on the primary capacity fade mechanism for the battery cell.

The battery health component 106 can determine a primary capacity fade mechanism (or cause of cell degradation) for the battery cell. The primary capacity fade mechanism can include one of loss of cyclable lithium ion, loss of anode active material, or loss of cathode active material. The battery health component can determine the battery health indicator based on the primary capacity fade mechanism.

To determine the primary capacity fade mechanism or primary mechanism of degradation, the battery health component 106 can compare values of the total cyclable Li+, anode capacity and cathode capacity. The battery health component 106 can normalize the values of the total cyclable Li+, anode capacity and cathode capacity, and then compare or rank the normalized values. The normalized value can include a percentage or ratio based on an original or initial value. For example, the total cyclable Li+ can be represented as a percentage of the initial total cyclable Li+; the anode capacity can be represented as a percentage of the initial total anode capacity; and the cathode capacity can be represented as a percentage of the initial total cathode capacity.

The battery health component 106 can determine the primary cause of cell degradation based on comparing each of the total cyclable Li+, amount of anode active material or anode capacity, and amount of cathode active material or cathode capacity with a respective threshold. If the total cyclable Li+ is less than or equal to a cyclable Li+ threshold, whereas the anode capacity and cathode capacity are greater than a respective anode capacity threshold and cathode capacity threshold, then the battery health component 106 can determine that the primary cell degradation mechanism is due to total cyclable Li+. If the total cyclable Li+ is greater than or equal to a cyclable Li+ threshold and the anode capacity is greater than an anode capacity threshold, but the cathode capacity is less than a cathode capacity threshold, then the battery health component 106 can determine that the primary cell degradation mechanism is due to cathode capacity. If the total cyclable Li+ is greater than or equal to a cyclable Li+ threshold and the cathode capacity is greater than a cathode capacity threshold, but the anode capacity is less than an anode capacity threshold, then the battery health component 106 can determine that the primary cell degradation mechanism is due to anode capacity.

Thus, as the cell ages, the cell OCV can change. The cell OCV can equal or be based on the difference between the anode OCV and the cathode OCV, and as the cell ages the shape of a curve given by anode OCV-cathode OCV can remain constant or substantially constant (e.g., within 5%, 10%, or 20%). While the shape of the OCV curve may remain constant, the stoichiometry range can change. For example, the "x" in $Li_xC_6$ can change. For example, x can be 0.8 to 0.1 initially at beginning of life. Therefore, the anode OCV and cathode OCV can remain constant, but the stoichiometry limits of each electrode in full-cell varies, which can cause a change in the cell OCV.

The battery health component 106 can generate a battery health indicator based on the cell open circuit voltage at multiple SOCs (e.g., 3 or 4 different SOCs such as 100%, 70%, 50%, and 20%). The battery health indicator can indicate or correspond to the value of one or more of the total cyclable Li+, anode capacity, and cathode capacity. The battery health indicator can include a score, numeric value, alphanumeric value, grade, range, data structure, percentage, or other indicator battery health. For example, the battery health indicator can identify the main or primary mechanism of degradation for the battery cell. The battery health indicator can identify one of the total cyclable Li+, anode capacity, and cathode capacity. The battery health indicator can state which one of the total cyclable Li+, anode capacity, or cathode capacity is the primary mechanism for cell degradation.

The battery controller component 108 can determine the battery health indicator for one or more battery cells. The battery controller component 108 can determine the battery health indicator for multiple cells of the battery 126. The battery controller component 108 can compare the battery health indicator, total cyclable Li+, anode capacity, or cathode capacity among the multiple cells of the battery 126. The battery controller component 108 can determine a primary cause of degradation based on the comparison. The battery controller component 108 can perform a statistical analysis to determine an average value, standard deviation, percentile or other relative or statistical value based on aggregating battery health indicator or values associated with multiple cells in the battery 126. The battery health indicator can be based on the analysis of multiple cells of the battery 126.

The battery management system 102 can include, execute, or other interface with a battery controller component 108 to select a command based on the battery health indicator to manage power consumption from the battery cell. The battery controller component 108 can select the command based on a primary capacity fade mechanism. The battery controller component 108 can provide the command for execution to manage the power consumption from the battery cell.

The battery controller component 108 can select or generate, based on the primary capacity fade mechanism or cell degradation mechanism determined by the battery health component 106, the command to manage a performance of the battery. The command can include a notification, indication, instruction, control command, or other output based on the battery health indicator. The battery controller component 108 can generate the command with an instruction to reduce the value of the current output by the battery 126. The battery controller component 108 can generate the command with an indication of remaining battery power (or total cyclable Li+, anode capacity or cathode capacity) to display via a display device 124 of the vehicle 118. The battery controller component 108 can terminate, responsive to the battery health indicator, current output from one or more cells of the battery 126. The battery controller component 108 can terminate, responsive to the battery health indicator, charging of one or more cells of the battery 126. The battery controller component 108 can provide an indication to replace the battery cell or battery 126 based on the battery health indicator. For example, if the primary cause of capacity fade or cell degradation is total cyclable Li+, then the battery controller component 108 can generate an indication to replace the battery cell.

The battery management system 102 (e.g., via controller component 108) can generate a command including an instruction to cause the onboard computing unit 120 of the vehicle 118 to execute an action such as displaying a notification via a display device 124 (e.g., vehicle dash, LCD, LED, or other electronic or digital visual display communicatively coupled to the onboard computing unit 120). For example, the visual output can include an alert, notification, warning, or suggestion to adjust, change, or terminate a function or aspect of the vehicle 118.

The battery management system 102 can generate the command in real-time responsive to receiving, measuring or detecting the value of the current. Generating the command in real-time can refer to generating the command within 1 minute, 2 minutes, 3 minutes, 4 minutes, 5 minutes, 6 minutes, or 10 minutes of detecting or determining the current output value of the battery 126. Generating the command in real-time can refer to generating a command indicative or responsive to the characteristic or performance of the battery 126 that is currently in use in the vehicle 118. Generating the command in real-time can refer to generating a command configured to improve a characteristic or behavior associated with the battery 126 or vehicle 118.

The battery management system 102 can select the command based on the battery health indicator. For example, the battery management system 102 can determine the battery health indicator based on the primary capacity fade mechanism being the loss of cathode active material. The battery management system 102 can select the command based on the primary capacity fade mechanism being the loss of cathode active material. In another example, the battery management system 102 can determine the battery health indicator based on the primary capacity fade mechanism being the loss of anode active material. The battery management system 102 can select the command based on the primary capacity fade mechanism being the loss of anode active material. In another example, the battery management system 102 can determine the battery health indicator based on the primary capacity fade mechanism being the loss of cyclable Li+. The battery management system 102 can select the command based on the primary capacity fade mechanism being the loss of cyclable Li+. The command can include an alert or notification of the primary fade mechanism. The command can include a control command to control an aspect of the battery 126 or vehicle 118.

As the battery 126 continues to be used, the battery management system 102 can measure, at a plurality of time intervals, the cell open circuit voltage at a predetermined number of states of charges. For example, every 2 weeks, the battery management system can determine the cell open circuit voltage for 100% SOC, 70%, SOC, 50% SOC, and 20% SOC. The battery management system 102 can determine, via the data fitting technique and based on the cell open circuit voltage measured at the plurality of time intervals at the predetermined number of states of charges, an updated total cyclable lithium ion for the battery cell. The battery management system 102 can update the battery health indicator based on the cell open circuit voltage measured at the plurality of time intervals at the predetermined number of states of charges and the updated cyclable lithium ion for the battery cell.

As the battery management system 102 determines an updated open circuit voltage for the battery cell, the battery management system 102 can determine an update total cyclable lithium ion for the battery cell and determine a second battery health indicator. The second battery health indicator can be different from the previous battery health indicator because the battery cell may have degraded as the battery 126 ages. Due to a different battery health indicator, the battery management system 102 can select a second command different from the command based on the second battery health indicator. The second command can be to disable the battery cell. For example, the first battery health indicator may have not indicated there was any cell degradation, whereas the second battery health indicator can convey cell degradation.

Figure 2:
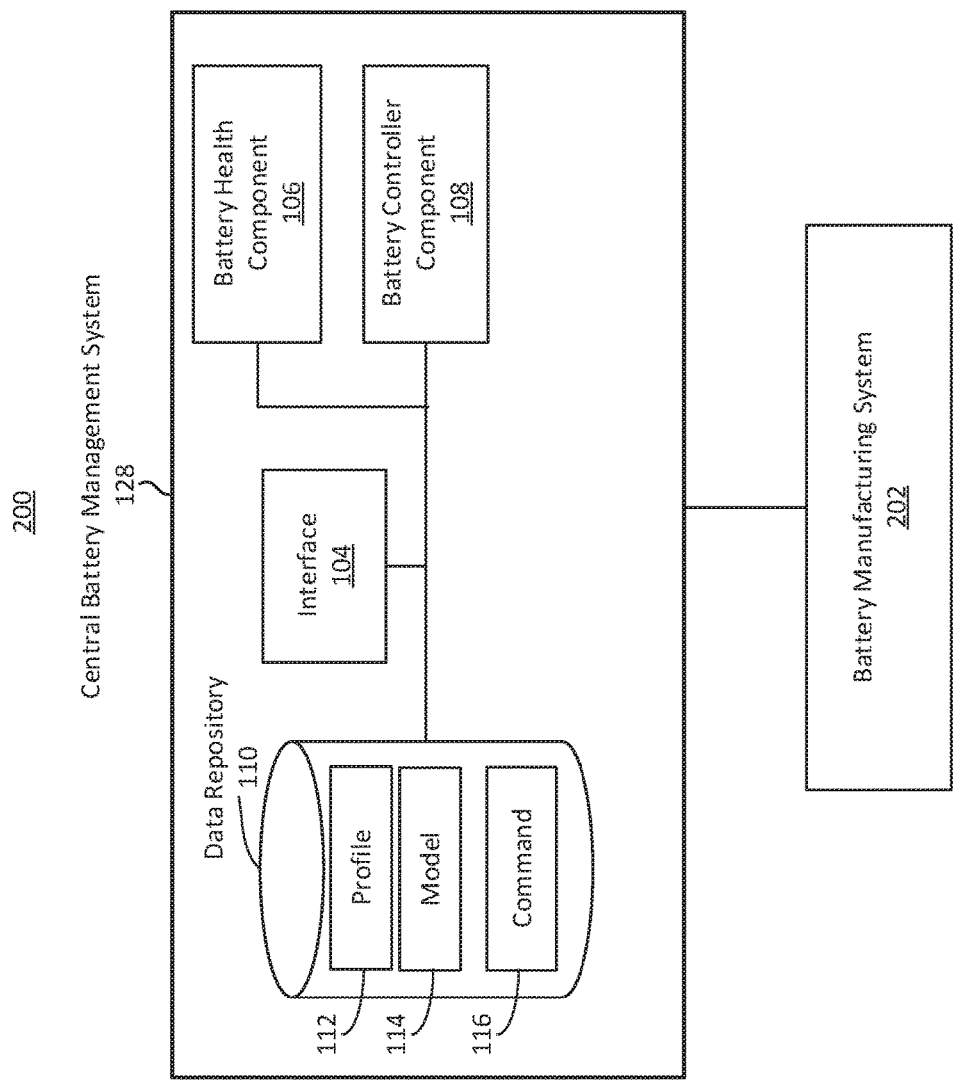
FIG. 2 depicts a block diagram depicting an example system to manage battery degradation to facilitate manufacturing of a battery, in accordance with an implementation.

FIG. 2 depicts a block diagram depicting an example system to manage battery performance to facilitate manufacturing of a battery, in accordance with an implementation. The system 200 can include the central battery management system 128 depicted in FIG. 1. The system 200 can include a battery manufacturing system 202. The battery manufacturing system 202 can refer to or include components or processes related to designing aspects of a battery 126, manufacturing a battery 126, or testing a battery 126. The central battery management system 128 can be configured to simulate battery performance, such as simulate, for a given battery profile and open circuit voltages for the full battery cell, anode or cathode. The central battery management system 128 can run simulations of the battery performance based on models 114 and profile 112 information in order to test whether a battery having the profile 112 functions in a desired manner. The central battery management system 128 can output or provide for display a total cyclable lithium-ion, anode capacity or cathode capacity. The battery designed, tested, or manufactured by, or using, the battery manufacturing system 202 can be installed or used in an electric vehicle, such as vehicle 118.

The central battery management system 128 can include on or more component or functionality of the battery management system 102. The central battery management system 128 can communicate with or receive or transmit data with the battery management system 102 via a network 101. The central battery management system 128 can be configured to run simulations on battery performance, and identify desired configurations for the battery 126. Upon identifying a desired configuration for the battery 126, or otherwise validating a battery configuration based on performance metrics such as heat generation rate and voltage levels, the central battery management system 128 can provide an indication of the validated or desired battery profile for use in a battery manufacturing system 202 (e.g., a battery design process).

Figure 3:
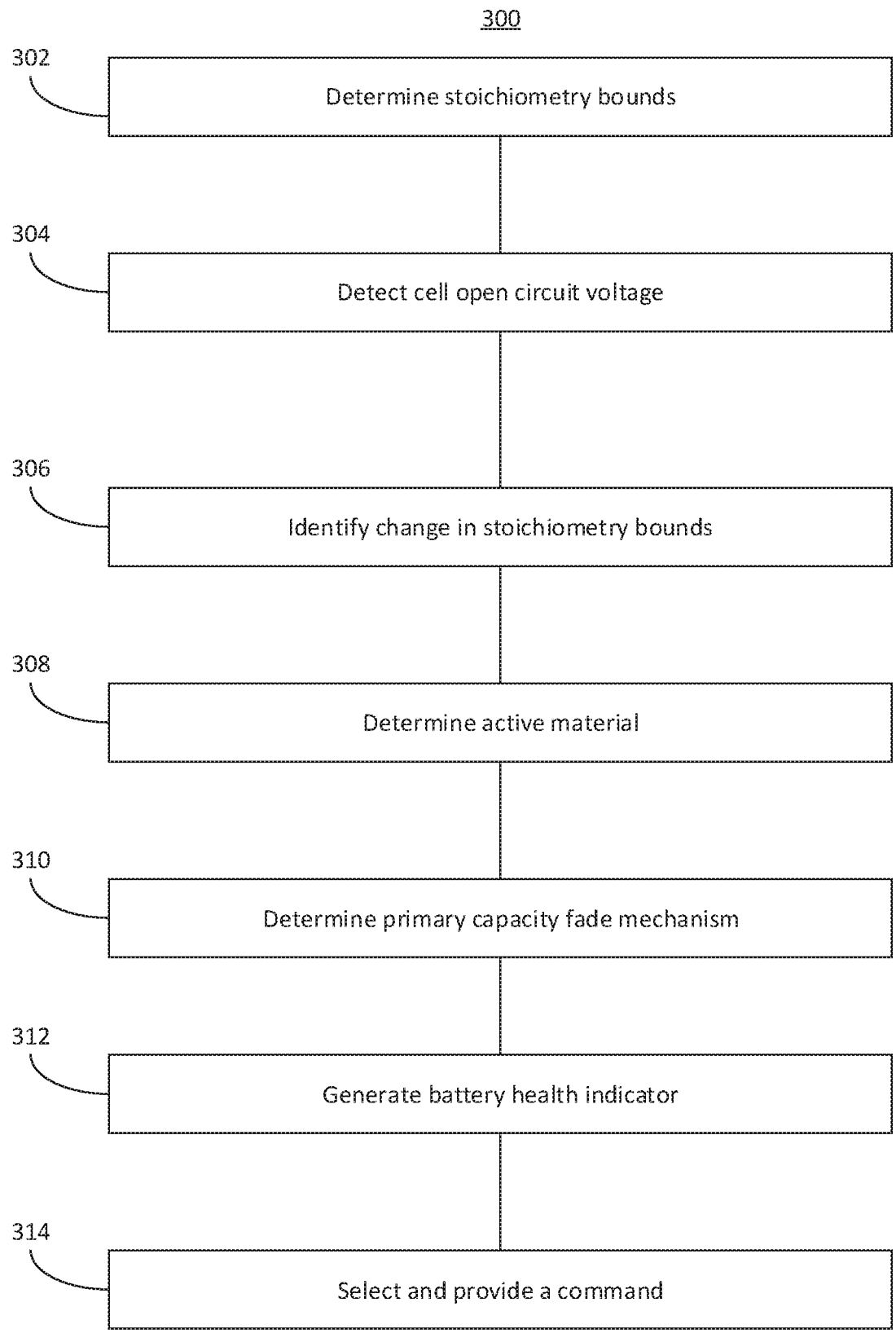
FIG. 3 depicts an example of a method of managing battery degradation, in accordance with an implementation.

FIG. 3 depicts an example method of managing battery degradation. The method 300 can be performed using one or more system or component depicted in FIGS. 1-2 and 4. For example, the method 300 can be performed by a BMS 102, vehicle 118, or central battery management system 128.

The technical solution provided by the method 300 can include determining a primary capacity fade mechanism or cell degradation mechanism more reliably, accurately and efficiently in a non-invasive manner. The method 300 solves the technical problem or challenge of determining the primary cause of cell degradation without having to measure, detect or simulate open circuit voltages at every state of charge across the full range of states of charges, or without having to invasive measure or detect particle variations in the battery cell.

At ACT 302, the method 300 includes a battery management system determining stoichiometry bounds. The battery management system can identify the stoichiometry bounds in full-cell for an anode of a battery cell at a minimum state of charge and a maximum state of charge. The battery management system can identify the stoichiometry bounds in full-cell for a cathode of the battery cell at the minimum state of charge and the maximum state of charge. The stoichiometry can refer to the relative quantities of an element in a compound or reaction. The battery management system can identify the amount of lithium in the anode and cathode. For example, the anode stoichiometry can refer to the variable "x" in $Li_xC_6$. The cathode stoichiometry can refer to the variable "y" in $Li_yNiCoAlO_2$. The stoichiometry can be initially determined from a battery profile or model. The stoichiometry can be a predetermined or preset stoichiometry for a fresh battery cell.

The battery management system can determine the anode and cathode stoichiometry bounds in full-cell based on fitting half-cell open circuit voltages and full-cell open circuit voltages corresponding to a battery cell. The data fitting technique can include, for example, a linear least squares data fitting technique.

At ACT 304, the battery management system can detect an open circuit voltage. The battery management system can detect the cell open circuit voltage at a plurality of states of charge of the battery cell subsequent to a rest duration (e.g., at least 2 hours, 3 hours, 4 hours or more). The cell open circuit voltage can be determined in an online mode. The plurality of states of charge can include, for example, 100%, 70%, 50%, or 20%.

The battery management system can detect an open circuit voltage for the anode of the battery cell and an open circuit voltage for the cathode of the battery cell. The battery management system can determine the open circuit voltage using a sensor, such as a voltmeter. The open circuit voltage can refer to the voltage of the anode or cathode when there is no current flowing. The open circuit voltage can change based on the level of charge or state of charge. Further, the amount of Li+ on the anode or cathode can impact the open circuit voltage. For example, when charging the battery, the Li+ can move from the cathode to the anode. When discharging the battery, the Li+ can move from the anode to the cathode. The open circuit voltage can be indicative of the health or life of the battery. As the cell ages, cyclable Li+ in a battery is lost. Thus, by determining the open circuit voltage at various states of charge, the battery management system can determine the amount of Li+ at the anode and cathode, and compute the amount of active materials at the anode and cathode (e.g., the anode capacity and the cathode capacity).

At ACT 306, the battery management system can identify, via a data fitting technique and the cell open circuit voltage at the plurality of states of charge, a change in the anode stoichiometry bounds in full-cell and a change in the cathode stoichiometry bounds in full-cell. The stoichiometry bounds can refer to or include a stoichiometry limit or range. The stoichiometry bounds or range or limit can refer to the change in the window of the open circuit voltage model curve, which is based on the anode OCV and cathode OCV. While the shape of the curve can remain constant, the window or stoichiometry range can change as the amount of cyclable Li+ and the amount of active materials in each electrode goes down as the cell ages.

At ACT 308, the battery management system can determine an amount of active material, such as an amount of total cyclable lithium ion for the battery cell, an amount of anode active material or an amount of cathode active material. The battery management system can use a data fitting technique and one or more of Functions 1-4 to determine the amount of active material.

At ACT 310, the battery management system can determine a primary capacity fade mechanism. The battery management system can determine, based on the total cyclable lithium ion for the battery cell, the anode active material and the cathode active material, the primary capacity fade mechanism for the battery cell as one of loss of cyclable lithium ion, loss of anode active material, or loss of cathode active material.

At ACT 312, the battery management system can generate a battery health indicator based on the primary capacity fade mechanism. The battery management system can generate a battery health indicator based on the cell open circuit voltage at multiple SOCs. The battery health indicator can indicate a primary cause of cell degradation or capacity fade. The battery health indicator can indicate that there has been no cell degradation or capacity fade. For example, the battery health indicator can indicate that the amount of anode active material or anode capacity, the amount of cathode active material or cathode capacity and total cyclable Li+ are greater than or equal to a threshold corresponding to a healthy or fresh battery cell.

The battery management system can determine that one of the loss of total cyclable Li+, loss of anode capacity or loss of cathode capacity is the primary cause of cell degradation. The battery management system can determine that all three of the loss in total cyclable Li+, loss in anode capacity and loss in cathode capacity are causes of cell degradation.

At ACT 314, the battery management system can select and provide a command. The battery management system can select a command based on the battery health indicator to manage power consumption from the battery cell. The command can be configured to reduce or mitigate cell degradation. The command can be configured to increase the life of the battery cell. The command can be configured to cause a replacement of the battery cell. The command can provide an alert or notification of the health of the battery cell. The battery management system can provide the command for execution to manage the power consumption from the battery cell. For example, the command can include an instruction or content for display via a graphical user interface on a display device of a vehicle. The command can include an instruction to disable a battery cell or reduce the amount of current or power drawn from a battery cell. The command can include a request or indication to replace a battery cell.

Figure 4:
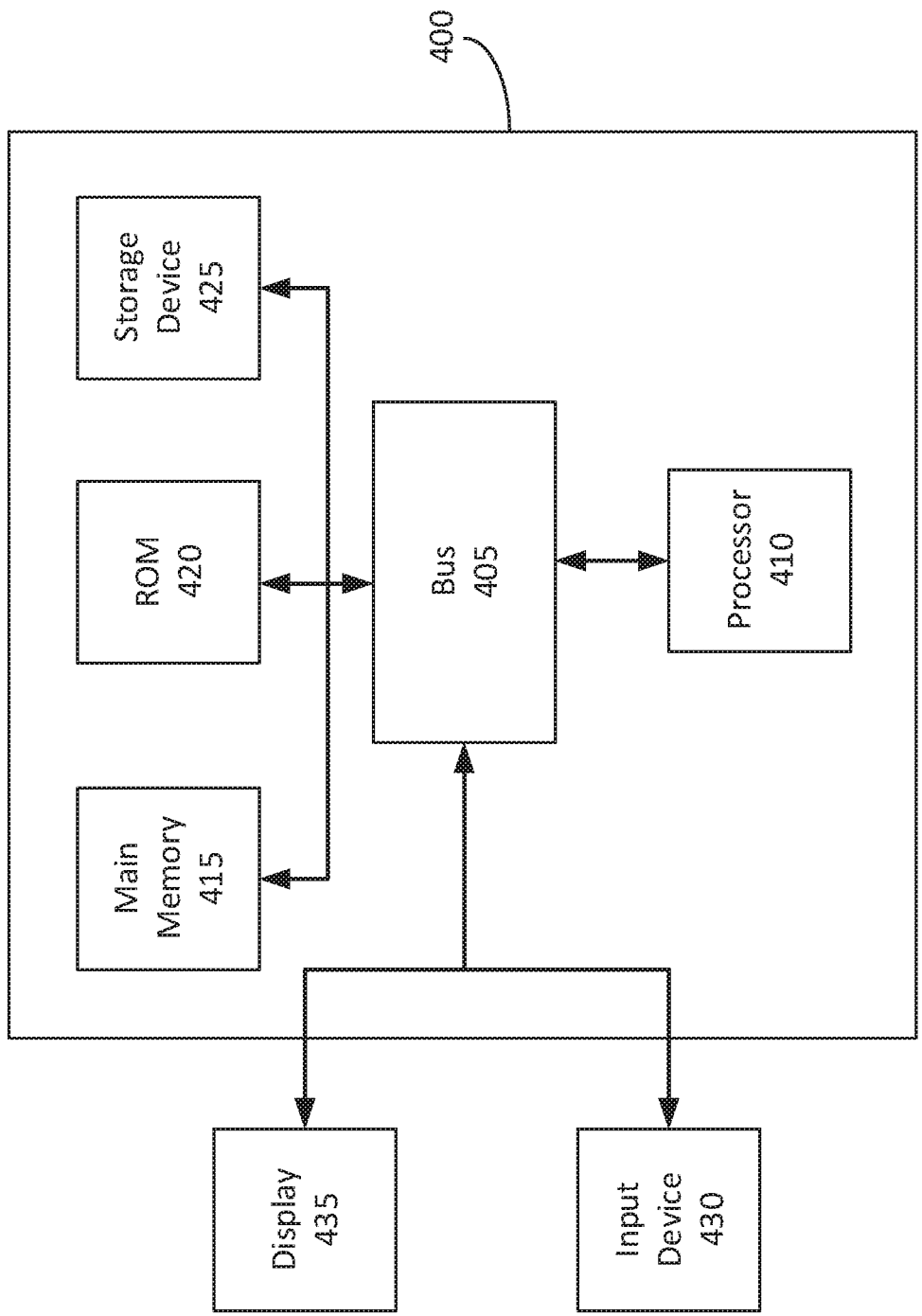
FIG. 4 is a block diagram illustrating an architecture for a computer system that can be employed to implement elements of the systems and methods described and illustrated herein, including, for example, the system depicted in FIGS. 1 and 2, and the method depicted in FIG. 3.

FIG. 4 is a block diagram of an example computer system 400. The computer system or computing device 400 can include or be used to implement the battery management system 102, or its components such as the battery management system 102. The computing system 400 includes at least one bus 405 or other communication component for communicating information and at least one processor 410 or processing circuit coupled to the bus 405 for processing information. The computing system 400 can also include one or more processors 410 or processing circuits coupled to the bus for processing information. The computing system 400 also includes at least one main memory 415, such as a random access memory (RAM) or other dynamic storage device, coupled to the bus 405 for storing information, and instructions to be executed by the processor 410. The main memory 415 can also be used for storing position information, vehicle information, command instructions, vehicle status information, environmental information within or external to the vehicle, road status or road condition information, or other information during execution of instructions by the processor 410. The computing system 400 may further include at least one read only memory (ROM) 420 or other static storage device coupled to the bus 405 for storing static information and instructions for the processor 410. A storage device 425, such as a solid state device, magnetic disk or optical disk, can be coupled to the bus 405 to persistently store information and instructions.

The computing system 400 may be coupled via the bus 405 to a display 435, such as a liquid crystal display, or active matrix display, for displaying information to a user such as a driver of the vehicle 118. An input device 430, such as a keyboard or voice interface may be coupled to the bus 405 for communicating information and commands to the processor 410. The input device 430 can include a touch screen display 435. The input device 430 can also include a cursor control, such as a mouse, a trackball, or cursor direction keys, for communicating direction information and command selections to the processor 410 and for controlling cursor movement on the display 435. The display 435 (e.g., on a vehicle dashboard) can be part of the battery management system 102, the sensor 122, or other component of FIG. 1, as well as part of the vehicle 118, for example.

The processes, systems and methods described herein can be implemented by the computing system 400 in response to the processor 410 executing an arrangement of instructions contained in main memory 415. Such instructions can be read into main memory 415 from another computer-readable medium, such as the storage device 425. Execution of the arrangement of instructions contained in main memory 415 causes the computing system 400 to perform the illustrative processes described herein. One or more processors in a multi-processing arrangement may also be employed to execute the instructions contained in main memory 415. Hard-wired circuitry can be used in place of or in combination with software instructions together with the systems and methods described herein. Systems and methods described herein are not limited to any specific combination of hardware circuitry and software.

Although an example computing system has been described in FIG. 4, the subject matter including the operations described in this specification can be implemented in other types of digital electronic circuitry, or in computer software, firmware, or hardware, including the structures disclosed in this specification and their structural equivalents, or in combinations of one or more of them.

Some of the description herein emphasizes the structural independence of the aspects of the system components (e.g., arbitration component), and the positioning component 105 and map data illustrates one grouping of operations and responsibilities of these system components. Other groupings that execute similar overall operations are understood to be within the scope of the present application. Modules can be implemented in hardware or as computer instructions on a non-transient computer readable storage medium, and modules can be distributed across various hardware or computer based components.

The systems described above can provide multiple ones of any or each of those components and these components can be provided on either a standalone system or on multiple instantiation in a distributed system. In addition, the systems and methods described above can be provided as one or more computer-readable programs or executable instructions embodied on or in one or more articles of manufacture. The article of manufacture can be cloud storage, a hard disk, a CD-ROM, a flash memory card, a PROM, a RAM, a ROM, or a magnetic tape. In general, the computer-readable programs can be implemented in any programming language, such as LISP, PERL, C, C++, C #, PROLOG, or in any byte code language such as JAVA. The software programs or executable instructions can be stored on or in one or more articles of manufacture as object code.

Example and non-limiting module implementation elements include sensors providing any value determined herein, sensors providing any value that is a precursor to a value determined herein, datalink or network hardware including communication chips, oscillating crystals, communication links, cables, twisted pair wiring, coaxial wiring, shielded wiring, transmitters, receivers, or transceivers, logic circuits, hard-wired logic circuits, reconfigurable logic circuits in a particular non-transient state configured according to the module specification, any actuator including at least an electrical, hydraulic, or pneumatic actuator, a solenoid, an op-amp, analog control elements (springs, filters, integrators, adders, dividers, gain elements), or digital control elements.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices include cloud storage). The operations described in this specification can be implemented as operations performed by a data processing apparatus on data stored on one or more computer-readable storage devices or received from other sources.

The terms "computing device", "component" or "data processing apparatus" or the like encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data can include non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The subject matter described herein can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or a combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While operations are depicted in the drawings in a particular order, such operations are not required to be performed in the particular order shown or in sequential order, and all illustrated operations are not required to be performed. Actions described herein can be performed in a different order.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. A reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

Systems and methods described herein may be embodied in other specific forms without departing from the characteristics thereof. For example, descriptions of positive and negative electrical characteristics (e.g., polarities) may be reversed. Elements described as negative elements can instead be configured as positive elements and elements described as positive elements can instead by configured as negative elements. The battery cells (e.g., batteries 126) can provide power to electric vehicles (including hybrids) as well as other machines that are not electric vehicles, such as unmanned robotic or other devices, including devices that are not transport vehicles. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. A system to manage battery cell degradation, comprising:
   a battery management system comprising one or more processors and non-transitory memory;
   a battery health component executed by the battery management system and programmed to:
      determine, based on a data fitting technique applied to half-cell open circuit voltages and full-cell open circuit voltages corresponding to a battery cell, anode stoichiometry bounds in full-cell corresponding to the battery cell at a minimum state of charge and a maximum state of charge, and cathode stoichiometry bounds in full-cell corresponding to the battery cell at the minimum state of charge and the maximum state of charge;
      receive, via one or more sensors, a measurement of a cell open circuit voltage at a plurality of states of charge of the battery cell subsequent to a rest duration;
      identify, via a data fitting technique and the cell open circuit voltage at the plurality of states of charge, a change in the anode stoichiometry bounds in full-cell and a change in the cathode stoichiometry bounds in full-cell;
      determine, responsive to the change in the anode stoichiometry bounds in full-cell and the change in the cathode stoichiometry bounds in full-cell, a total cyclable lithium ion for the battery cell, an amount of anode active material and an amount of cathode active material;
      determine, based on the total cyclable lithium ion for the battery cell, the amount of anode active material and the amount of cathode active material, a primary capacity fade mechanism for the battery cell comprising one of loss of cyclable lithium ion, loss of anode active material, or loss of cathode active material; and
      generate a battery health indicator based on the primary capacity fade mechanism for the battery cell; and
   a battery controller component, executed by the battery management system, selects a command
      based on the battery health indicator to manage power consumption from the battery cell, the command comprising at least one of an instruction to reduce a value of current output by the battery cell, an instruction to terminate current output from the battery cell or an instruction to terminate charging the battery cell; and
   executes the command to manage the power consumption from the battery cell.

2. The system of claim 1, comprising:
   the battery management system further programmed to determine the battery health indicator based on the primary capacity fade mechanism being the loss of cathode active material.

3. The system of claim 1, comprising:
   the battery management system further programmed to select the command based on the primary capacity fade mechanism being the loss of anode active material.

4. The system of claim 1, comprising:
   an electric vehicle;
   the battery cell to provide power to the electric vehicle.

5. The system of claim 1, comprising the battery management system further programmed to:
   determine stoichiometry bounds for an anode in half-cell corresponding to the battery cell based on an open circuit voltage of the anode in half-cell at a first state-of-charge and an open circuit voltage of the anode in half-cell at a second state-of-charge; and
   determine the stoichiometry bounds for a cathode in half-cell corresponding to the battery cell based on an open circuit voltage of the cathode in half-cell at the first state-of-charge and an open circuit voltage of the cathode in half-cell at the second state-of-charge.

6. The system of claim 5, wherein the first state-of-charge is 0%, and the second state-of-charge is 100%.

7. The system of claim 1, comprising the battery management system further programmed to:
   measure open circuit voltages of an anode in half-cell corresponding to the battery cell based on a dissected battery cell; and
   measure open circuit voltages of a cathode in half-cell corresponding to the battery cell based on the dissected battery cell.

8. The system of claim 1, comprising the battery management system further programmed to:

charge and discharge the battery cell at a rate less than or equal to a threshold of C/50 to detect open circuit voltage for an anode of the battery cell.

9. The system of claim 1, comprising the battery management system further programmed to:
measure, at a plurality of time intervals, the cell open circuit voltage at a predetermined number of states of charges;
determine, via the data fitting technique and based on the cell open circuit voltage measured at the plurality of time intervals at the predetermined number of states of charges, an updated total cyclable lithium ion for the battery cell; and
update the battery health indicator based on the cell open circuit voltage measured at the plurality of time intervals at the predetermined number of states of charges and the updated total cyclable lithium ion for the battery cell.

10. The system of claim 1, comprising the battery management system further programmed to:
determine an updated open circuit voltage for the battery cell;
determine an updated total cyclable lithium ion for the battery cell;
determine a second battery health indicator different from the battery health indicator;
select a second command different from the command based on the second battery health indicator, the second command configured to disable the battery cell.

11. The system of claim 1, comprising:
the battery management system further programmed to determine the total cyclable lithium ion for the battery cell absent the cell open circuit voltage across an entire cell state-of-charge range.

12. The system of claim 1, comprising:
the battery management system further programmed to determine the total cyclable lithium ion for the battery cell based on a subset of cell open circuit voltages across a cell state-of-charge range.

13. A method of managing battery cell degradation, comprising:
determining, by a battery management system comprising one or more processors and non-transitory memory, based on fitting half-cell open circuit voltages and full-cell open circuit voltages corresponding to a battery cell, anode stoichiometry bounds in full-cell corresponding to the battery cell at a minimum state of charge and a maximum state of charge, and cathode stoichiometry bounds in full-cell corresponding to the battery cell at the minimum state of charge and the maximum state of charge;
receiving, by the battery management system via one or more sensors, a cell open circuit voltage at a plurality of states of charge of the battery cell subsequent to a rest duration;
identifying, by the battery management system via a data fitting technique and the cell open circuit voltage at the plurality of states of charge, a change in the anode stoichiometry bounds in full-cell and a change in the cathode stoichiometry bounds in full-cell;
determining, by the battery management system responsive to the change in the anode stoichiometry bounds in full-cell and the change in the cathode stoichiometry bounds in full-cell, a total cyclable lithium ion for the battery cell, an amount of anode active material and an amount of cathode active material;
determining, by the battery management system based on the total cyclable lithium ion for the battery cell, the amount of anode active material and the amount of cathode active material, a primary capacity fade mechanism for the battery cell comprising one of loss of cyclable lithium ion, loss of anode active material, or loss of cathode active material;
generating, by the battery management system, a battery health indicator based on the primary capacity fade mechanism for the battery cell;
selecting, by the battery management system, a command based on the battery health indicator to manage power consumption from the battery cell, the command comprising at least one of an instruction to reduce a value of current output by the battery cell, an instruction to terminate current output from the battery cell or an instruction to terminate charging the battery cell; and
executing, by the battery management system, the command to manage the power consumption from the battery cell.

14. The method of claim 13, comprising:
determining the total cyclable lithium ion for the battery cell absent the cell open circuit voltage across an entire cell state-of-charge range.

15. The method of claim 13, comprising:
determining the battery health indicator based on the primary capacity fade mechanism being the loss of cyclable lithium ion.

16. The method of claim 13, comprising:
selecting, by the battery management system, the command based on the primary capacity fade mechanism being the loss of anode active material.

17. The method of claim 13, comprising:
providing, by the battery cell, power to an electric vehicle.

18. The method of claim 13, comprising:
determining stoichiometry bounds for an anode in half-cell corresponding to the battery cell based on an open circuit voltage of the anode at a first state-of-charge and an open circuit voltage of the anode at a second state-of-charge; and
determining stoichiometry bounds for a cathode in half-cell corresponding to the battery cell based on an open circuit voltage of the cathode at the first state-of-charge and an open circuit voltage of the cathode at the second state-of-charge.

19. The method of claim 18, wherein the first state-of-charge is 0%, and the second state-of-charge is 100%.

20. The method of claim 13, comprising:
measuring, at a plurality of time intervals, the cell open circuit voltage at a predetermined number of states of charges;
determining, via the data fitting technique and based on the cell open circuit voltage measured at the plurality of time intervals at the predetermined number of states of charges, an updated total cyclable lithium ion for the battery cell; and
updating the battery health indicator based on the cell open circuit voltage measured at the plurality of time intervals at the predetermined number of states of charges and the updated total cyclable lithium ion for the battery cell.

* * * * *